US012772497B2

(12) United States Patent
Kang et al.

(10) Patent No.: US 12,772,497 B2
(45) Date of Patent: Oct. 20, 2026

(54) COMPLEMENTARY METAL-OXIDE-SEMICONDUCTOR (CMOS) APPARATUS WITH SELF-ALIGNED BACKSIDE CONTACT

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 510 days.

(21) Appl. No.: 17/946,017

(22) Filed: Sep. 15, 2022

(65) Prior Publication Data

US 2024/0096978 A1 Mar. 21, 2024

(51) Int. Cl.

*H10D 84/00* (2025.01)
*H10D 30/01* (2025.01)
*H10D 30/43* (2025.01)
*H10D 30/67* (2025.01)
*H10D 62/10* (2025.01)
(Continued)

(52) U.S. Cl.

CPC ....... *H10D 30/6729* (2025.01); *H10D 30/014* (2025.01); *H10D 30/43* (2025.01); *H10D 30/6735* (2025.01); *H10D 62/121* (2025.01); *H10D 64/017* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 84/85* (2025.01)

(58) Field of Classification Search

CPC .... H10D 84/851; H10D 84/852; H10D 84/85; H10D 84/83125; H10D 84/832; H10D 84/833

See application file for complete search history.

(56) References Cited

U.S. PATENT DOCUMENTS

| | | | |
|---|---|---|---|
| 9,614,056 | B2 | 4/2017 | Xie |
| 11,239,236 | B2 | 2/2022 | Lilak |

(Continued)

FOREIGN PATENT DOCUMENTS

| | | | |
|---|---|---|---|
| CN | 103091369 A | 5/2013 | |
| CN | 103713019 A | 4/2014 | |

(Continued)

OTHER PUBLICATIONS

J. Ryckaert et al., "Enabling Sub-5nm CMOS Technology Scaling Thinner and Taller!, " 2019 IEEE International Electron Devices Meeting (IEDM), 2019, pp. 29.4.1-29.4.4, doi: 10.1109/IEDM19573.2019.8993631.

(Continued)

*Primary Examiner* — Reema Patel
(74) *Attorney, Agent, or Firm* — Seed Intellectual Property Law Group LLP

(57) ABSTRACT

A CMOS apparatus includes an n-doped field effect transistor (nFET); and a p-doped field effect transistor (pFET), each of which has a source structure and a drain structure. A common backside drain contact, which is disposed at the backside surface of the nFET and the pFET, electrically connects the nFET drain structure and the pFET drain structure to a backside interconnect layer.

8 Claims, 14 Drawing Sheets

(51) Int. Cl.

| | |
|---|---|
| ***H10D 64/01*** | (2025.01) |
| ***H10D 84/01*** | (2025.01) |
| ***H10D 84/03*** | (2025.01) |
| ***H10D 84/85*** | (2025.01) |

(56) References Cited

U.S. PATENT DOCUMENTS

| | | | | |
|---|---|---|---|---|
| 2020/0204175 | A1* | 6/2020 | Liang | H10D 30/6729 |
| 2021/0193821 | A1 | 6/2021 | Dentoni Litta | |
| 2021/0210489 | A1 | 7/2021 | Zhang | |
| 2021/0376076 | A1 | 12/2021 | Su | |
| 2021/0376093 | A1 | 12/2021 | Chu | |
| 2022/0093647 | A1 | 3/2022 | Sung | |
| 2022/0139914 | A1 | 5/2022 | Cheng | |
| 2022/0328641 | A1* | 10/2022 | Liaw | H10D 30/014 |

FOREIGN PATENT DOCUMENTS

| | | | |
|---|---|---|---|
| CN | 103901075 | A | 7/2014 |
| CN | 103826840 | B | 4/2017 |
| JP | 2019-138663 | A | 8/2019 |

OTHER PUBLICATIONS

P. Weckx et al., “Novel forksheet device architecture as ultimate logic scaling device towards 2nm,” 2019 IEEE International Electron Devices Meeting (IEDM), 2019, pp. 36.5.1-36.5.4, doi: 10.1109/IEDM19573.2019.8993635.

T. Burke, “Implementation of High-k/Metal Gates in High-Volume Manufacturing,” Applied Materials White Paper, Oct. 2017, pp. 1-5.

* cited by examiner

COMPLEMENTARY METAL-OXIDE-SEMICONDUCTOR (CMOS) APPARATUS WITH SELF-ALIGNED BACKSIDE CONTACT

BACKGROUND

The present invention relates to the electrical, electronic, and computer arts, and more specifically, to complementary metal-oxide-semiconductor (CMOS) technology.

FIG. 1 depicts a sectioned view of a conventional CMOS apparatus 100 through respective drains 103, 105 of an n-doped field effect transistor (nFET) and a p-doped field effect transistor (pFET). The FETs can be connected to each other and/or the CMOS apparatus 100 may be connected to other components to form, for example, an inverter or another type of CMOS logic gate/element. The drains 103, 105 (and indeed the entire device 100) are formed on a substrate 108. A common contact 107 electrically connects the drains 103, 105 to an interconnect layer 112 that provides input voltage and receives output voltage for the CMOS apparatus 100. Typically, the interconnect layer is a "back-end-of-line (BEOL) layer" that is formed at the frontside of the device 100 (i.e., the side opposite to the substrate 108) during back-end-of-line processing. Sources of the device 100 (not shown) similarly are connected separately to input voltage traces of the interconnect layer 112. A dielectric pillar 109 isolates the pFET drain 103 from the nFET drain 105. Shallow trench isolation 110 and an interlayer dielectric 111 further insulate the CMOS apparatus 100 from adjacent devices. A dielectric cap 114 isolates the CMOS apparatus 100 from the interconnect layer 112.

SUMMARY

Principles of the invention provide techniques for a CMOS apparatus with a self-aligned backside contact.

In one aspect, an exemplary CMOS apparatus includes an interconnect layer, which has a front side and a backside opposite the front side; an n-doped field effect transistor (nFET), which includes an nFET drain structure; a p-doped field effect transistor (pFET), which includes a pFET drain structure; and a backside drain contact, which is disposed at a backside surface of the nFET and the pFET and is electrically connected to the nFET drain structure and to the pFET drain structure. The nFET also includes an nFET source structure, and an nFET channel structure that is connected between the nFET drain structure and the nFET source structure. The nFET has a front side surface adjacent the interconnect layer and a backside surface opposite the interconnect layer. The pFET also includes a pFET source structure, and a pFET channel structure that is connected between the pFET drain structure and the pFET source structure. The pFET has a front side surface adjacent the interconnect layer and a backside surface opposite the interconnect layer.

According to another aspect, a method for making a CMOS apparatus includes obtaining a precursor to the CMOS apparatus; forming, in a backside dielectric of the precursor, a trench that contacts backside surfaces of adjacent drain structures; and filling the trench, from the backside of the device, with a conductive material such that the conductive material contacts the backside surfaces of the adjacent drain structures and also contacts the adjacent facing surfaces of the adjacent drain structures. The precursor includes an nFET drain structure; a pFET drain structure that is adjacent to the nFET drain structure; and a dielectric pillar that extends from the backside dielectric between and contacting adjacent facing surfaces of the adjacent drain structures. Forming the trench includes removing the dielectric pillar.

In view of the foregoing, techniques of the present invention can provide substantial beneficial technical effects. For example, one or more embodiments provide one or more of.

Improved conductivity of a CMOS apparatus from the power rail to $V_{out}$, which enables faster switching.

Enhanced accuracy of backside contact formation by using a self-aligned scheme that removes the isolation wall between the nFET and pFET drains in a forksheet CMOS apparatus.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

Figure 1:
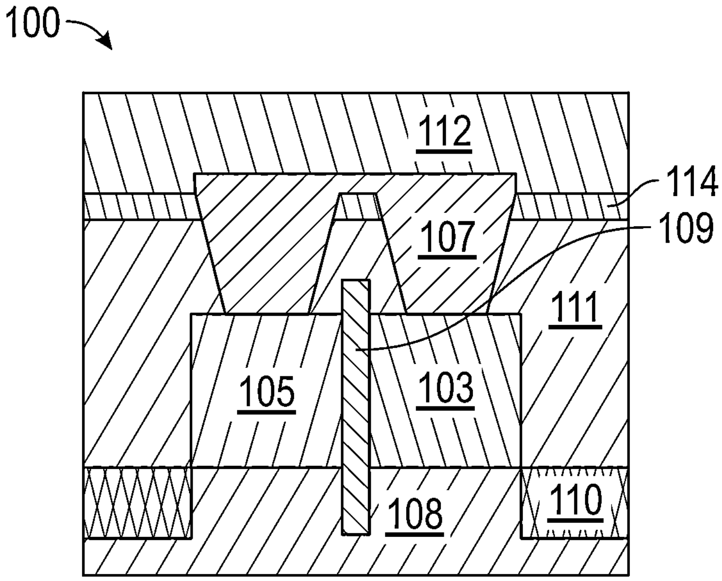
FIG. 1 PRIOR ART
FIG. 1 depicts a sectioned view of a prior-art CMOS apparatus.
Figure 2:
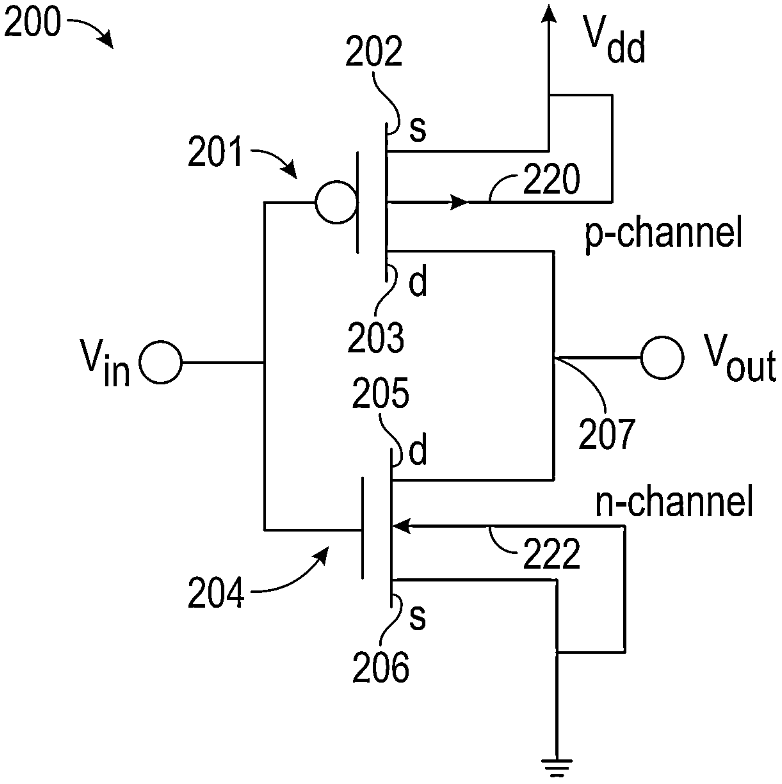
FIG. 2 depicts a schematic of a complementary metal oxide semiconductor (CMOS) apparatus, according to exemplary embodiments.

FIG. 2 depicts a schematic of a complementary metal-oxide-semiconductor (CMOS) apparatus 200, which pairs a p-doped field effect transistor (pFET) 201 with an n-doped field effect transistor (nFET) 204. The pFET 201 includes source 202 (also referred to herein as the "pFET source structure") and drain 203, connected by channel structure 220; the nFET 204 includes source 206 (also referred to herein as the "nFET source structure") and drain 205, connected by channel structure 222.

Figure 3:
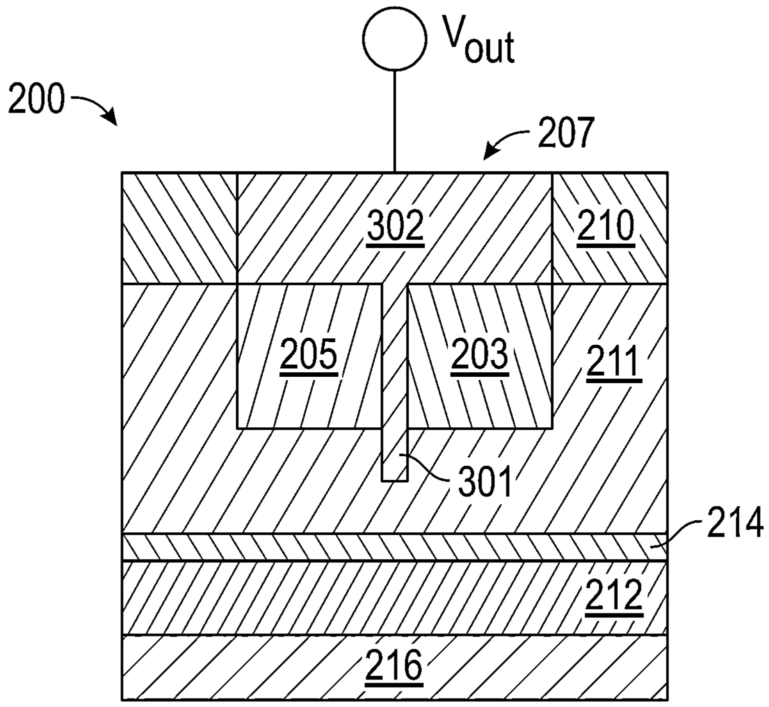
FIG. 3 depicts a sectioned view of the CMOS apparatus that is shown in FIG. 2.

FIG. 3 depicts a sectioned view of the CMOS apparatus 200, according to exemplary embodiments. The CMOS apparatus 200 includes the nFET drain structure 203, the pFET drain structure 205, and a t-shaped backside contact 207 that is electrically connected to a backside interconnect layer (represented schematically as $V_{out}$). The CMOS apparatus 200 also includes shallow trench isolation 210, an interlayer dielectric 211, an interconnect layer 212, a dielectric cap 214, and a carrier wafer 216. The carrier wafer covers the interconnect layer 212 at a front side of the transistor 200. The contact 207 is at a backside of the transistor 200, opposite to the carrier wafer. The CMOS apparatus 200 also includes nFET and pFET source structures 202, 206 (shown in FIG. 2, but not in FIG. 3), which are electrically connected to the interconnect layer.

Figure 4:
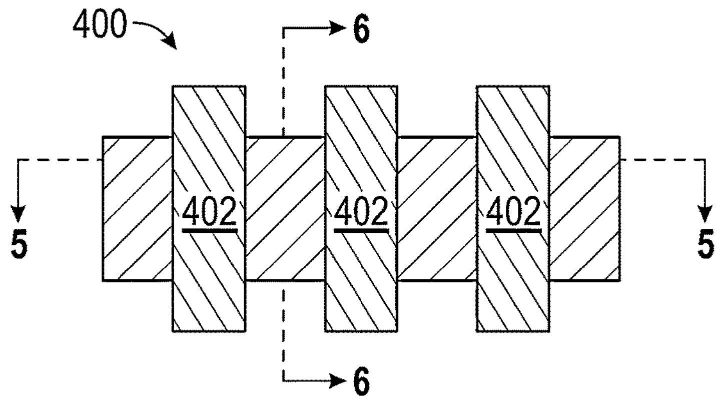
FIG. 4 through FIG. 6 depict sectioned views of a blank that is used in fabricating the CMOS apparatus that is shown in FIG. 3.
Figure 5:
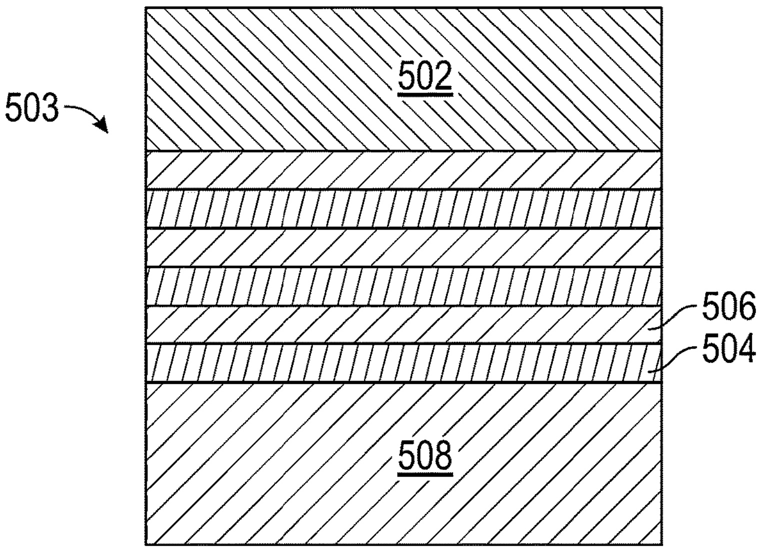
Figure 6:
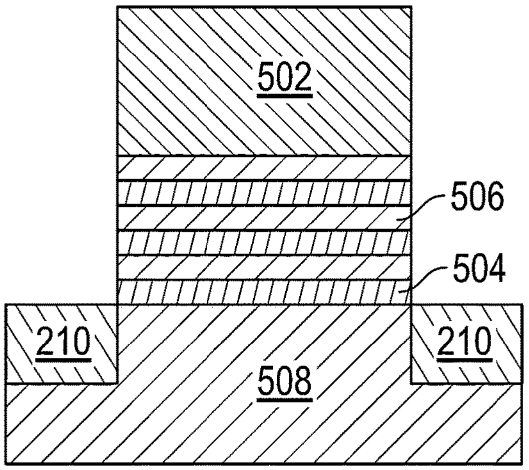

FIG. 4 through FIG. 6 depict sectioned views of a blank 400 that is used in forming the CMOS apparatus that is shown in FIG. 3. FIG. 5 and FIG. 6, respectively, are taken along view lines 5 and 6 in FIG. 4. The blank 400 includes a hard mask 502 atop a nanosheet stack 503. The nanosheet stack 503 includes sacrificial SiGe layers 504 as well as silicon layers 506 that will become channel structures 220, 222 in the final CMOS apparatus 200. The nanosheet stack 503 has been epitaxially grown from a substrate 508. In one or more embodiments, the substrate 508 includes silicon; in one or more embodiments, the substrate 508 consists essentially of silicon. Shallow trench isolation (STI) 310 separates the nanosheet stack 503 from any adjoining structures. The regions marked as gates 402 are not yet completed in FIG. 4 through FIG. 24.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

Various structures that are described herein, e.g., source/drain structures, may be epitaxially grown. "Epitaxy" or "epitaxial growth," as used herein, refers to a process by which a layer of single-crystal or large-grain polycrystalline material is formed on an existing material with similar crystalline properties. One feature of epitaxy is that this process causes the crystallographic structure of the existing substrate or seed layer (including any defects therein) to be reproduced in the epitaxially grown material. Epitaxial growth can include heteroepitaxy (i.e., growing a material with a different composition from its underlying layer) or homoepitaxy (i.e., growing a material which includes the same composition as its underlying layer). Heteroepitaxy can introduce strain in the epitaxially grown material, as its crystal structure may be distorted to match that of the underlying layer. In certain applications, such strain may be desirable. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

A number of different precursors may be used for the epitaxial deposition of the in-situ doped semiconductor material. In some embodiments, the gas source for the deposition of an epitaxially formed in-situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-doped or n-doped. As further used herein, "p-doped" refers to the addition of impurities to an intrinsic semiconductor that creates deficiencies of valence electrons. In a silicon-containing substrate, examples of p-doped dopants, i.e., impurities include but are not limited to: boron, aluminum, gallium and indium. As used herein, "n-doped" refers to the addition of impurities that contribute free electrons to an intrinsic semiconductor. Examples of n-doped dopants, i.e., impurities in a silicon-containing substrate include but are not limited to antimony, arsenic and phosphorous.

Figure 7:
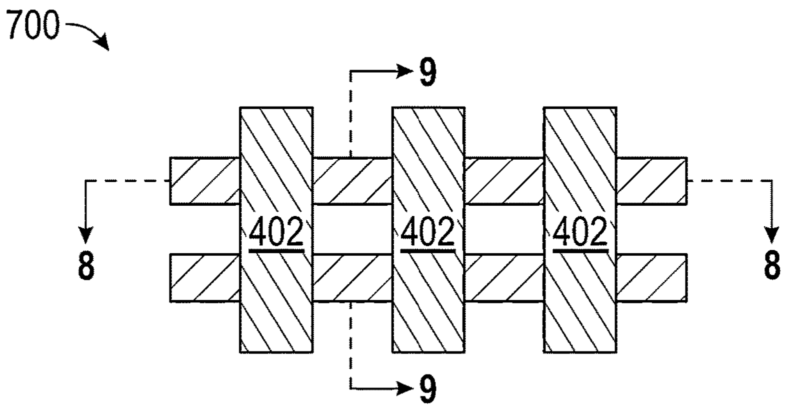
FIG. 7 through FIG. 9 depict sectioned views of an intermediate structure after forming a dielectric pillar trench.
Figure 8:
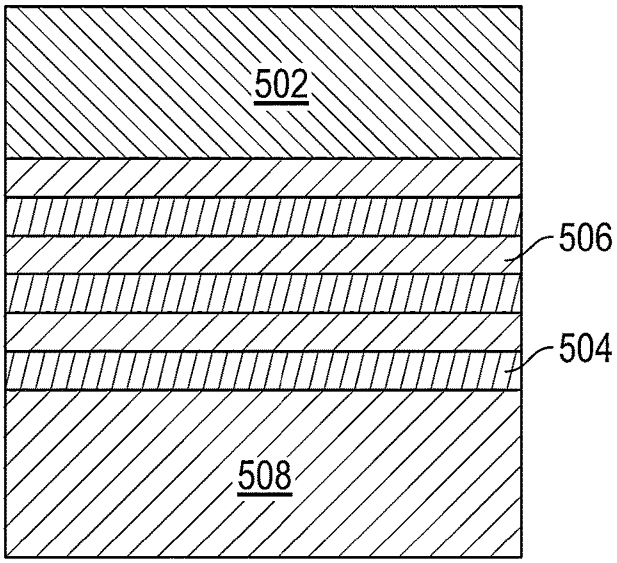
Figure 9:
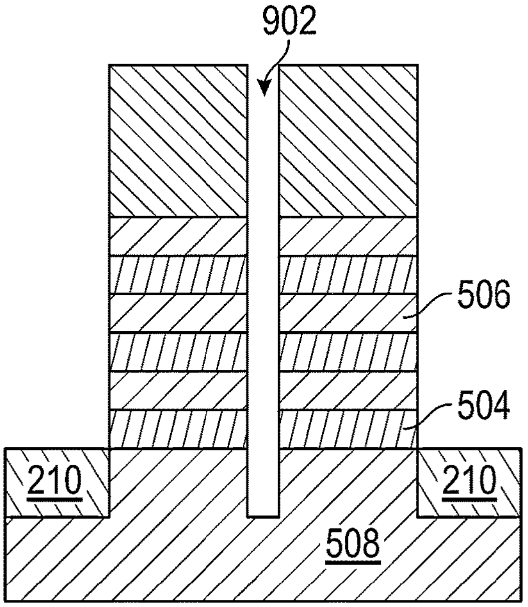

FIG. 7 through FIG. 9 depict sectioned views of an intermediate structure 700 after forming a dielectric pillar trench 902. FIG. 8 and FIG. 9, respectively, are taken along view lines 8 and 9 in FIG. 7. The trench 902 can be formed by anisotropic etching. One example of anisotropic etching is reactive ion etching (RIE). Suitable ions for RIE of silicon include sodium hydroxide (NaOH). Suitable ions for RIE of silicon-germanium alloys include carbon fluoride (CF) or silicon chloride ($SiCl_4$). Suitable ions for RIE of, e.g., a silicon nitride hard mask include carbon fluoride (e.g., $C_2F_6$).

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching are well understood by those skilled in the art and, as such, a more detailed description of such processes is not presented herein.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

Figure 10:
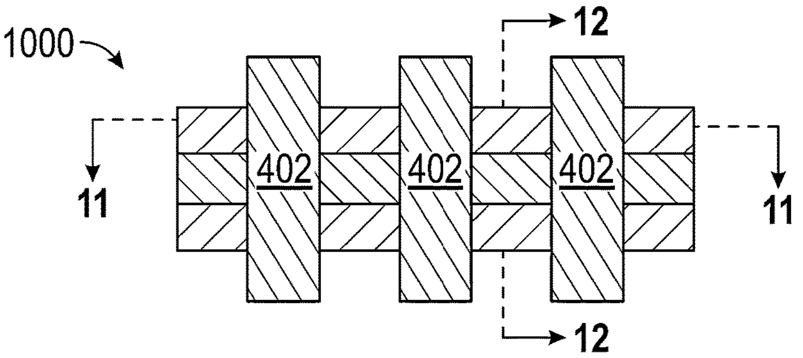
FIG. 10 through FIG. 12 depict sectioned views of an intermediate structure after filling a dielectric pillar into the dielectric pillar trench.
Figure 11:
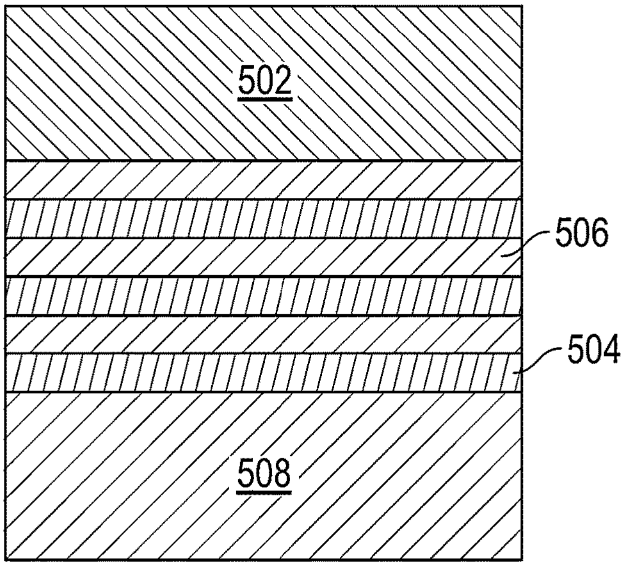
Figure 12:
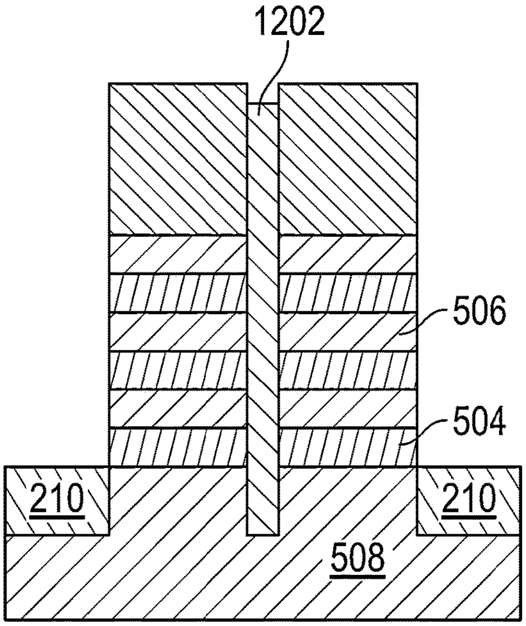

FIG. 10 through FIG. 12 depict sectioned views of an intermediate structure 1000 after filling a dielectric pillar 1202 into the dielectric pillar trench. FIG. 11 and FIG. 12, respectively, are taken along view lines 11 and 12 in FIG. 10. Suitable materials for the dielectric pillar include, e.g., silicon nitride; silicon carbide; silicon oxide; other low-k dielectrics that are relatively easy to etch selective to silicon and selective to high-k metal gate materials. In addition to etch chemistries previously mentioned, other etchants will be apparent to the skilled worker.

Figure 13:
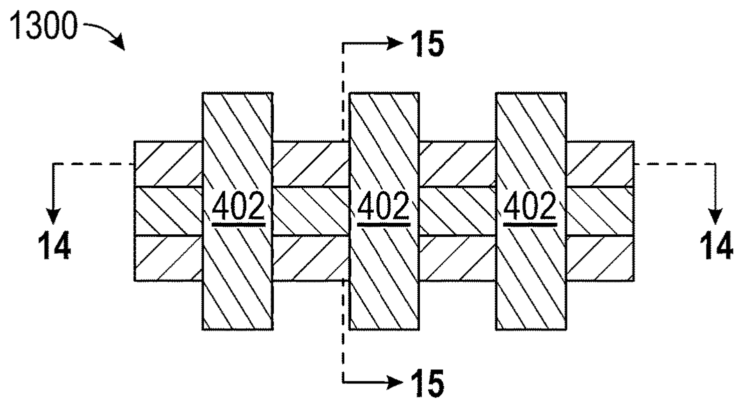
FIG. 13 through FIG. 15 depict sectioned views of an intermediate structure after depositing a dummy gate and a hard mask and forming precursors to drain trenches.
Figure 14:
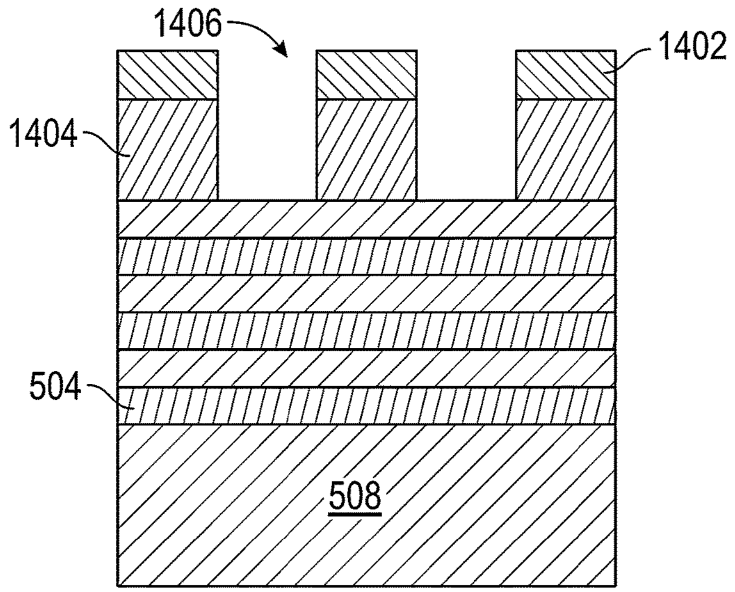
Figure 15:
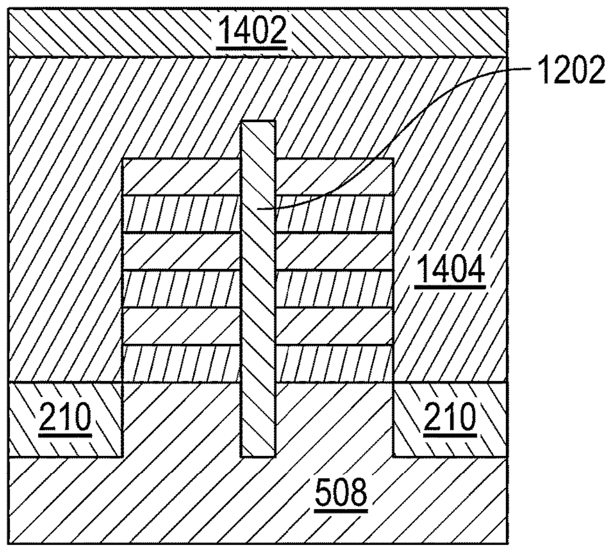
Figure 16:
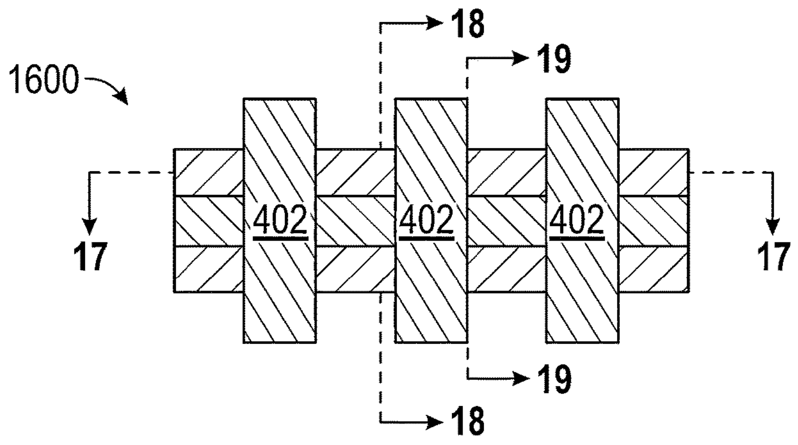
FIG. 16 through FIG. 19 depict sectioned views of an intermediate structure after depositing gate spacers and fully recessing the drain trenches.

FIG. 13 through FIG. 15 depict sectioned views of an intermediate structure 1300 after depositing a dummy gate 1404 and a hard mask 1402 and forming preliminary trenches 1406 that will be completed in a later step (as shown in FIG. 16 through FIG. 19) to form trenches 1702, in which the source/drain structures 203, 205, 202, 206 will be formed (as later shown in FIG. 25 through FIG. 29). FIG. 14 and FIG. 15, respectively, are taken along view lines 14 and 15 in FIG. 13. Suitable materials for the dummy gate 1404 include, e.g., amorphous silicon, silicon-germanium, or other material that is relatively easy to etch selective to epitaxially grown silicon. Suitable materials for the hard mask 1402 include, e.g., silicon carbide, silicon nitride, silicon oxide.

Figure 17:
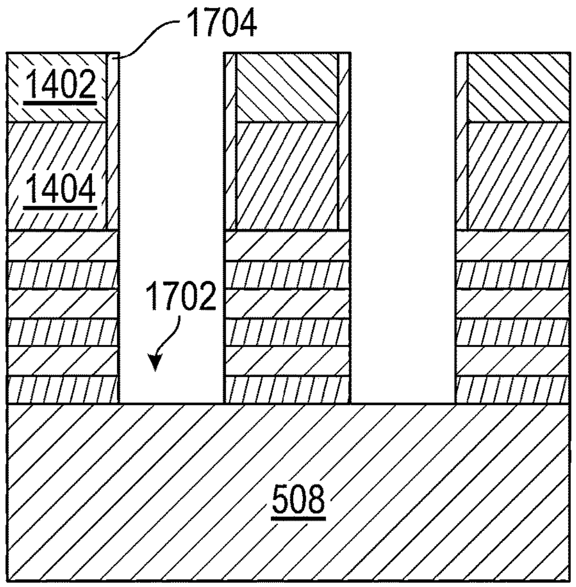
Figure 18:
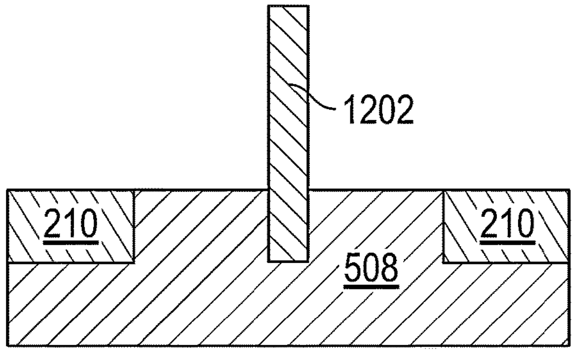
Figure 19:
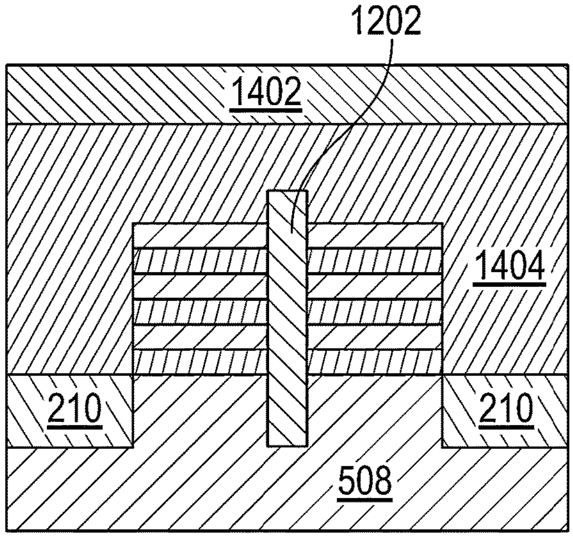
Figure 20:
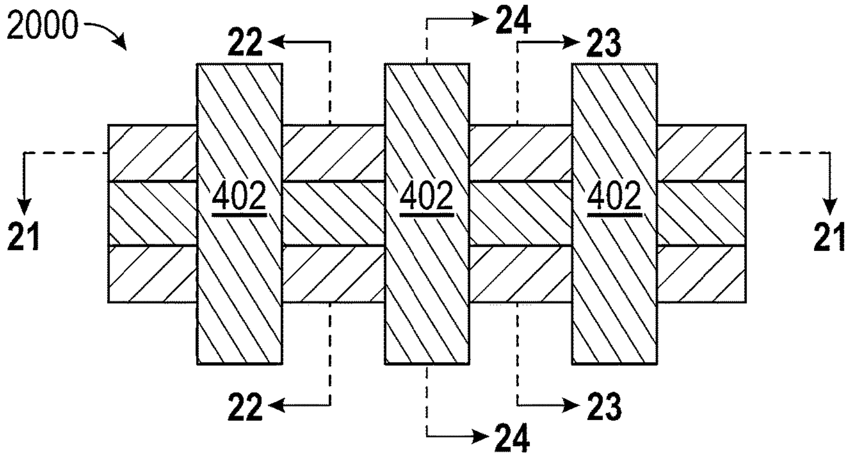
FIG. 20 through FIG. 24 depict sectioned views of an intermediate structure after further etching the drain trench.

FIG. 16 through FIG. 19 depict sectioned views of an intermediate structure 1600 after depositing gate spacers 1704 and then fully recessing the source/drain trenches 1702. FIG. 17, FIG. 18, and FIG. 19, respectively, are taken along view lines 17, 18, and 19 in FIG. 16. Suitable materials for the gate spacers 1704 include, e.g., silicon nitride, silicon carbide, silicon oxide, or other low-k dielectric material. In one or more embodiments, in which the gate spacers 1704 may be similar chemistry to the hard mask 1402, wet etch would not be suitable for removing the hard mask 1402. Instead, chemical mechanical planarization or another anisotropic process would be used.

FIG. 20 through FIG. 24 depict sectioned views of an intermediate structure 2000 after further etching the drain trench 2102. FIG. 21, FIG. 22, FIG. 23, and FIG. 24, respectively, are taken along view lines 21, 22, 23, and 24 in FIG. 20. In one or more embodiments, anisotropic etching, such as RIE, may be used for completing the drain trench 2102. Suitable ions for such etching include, e.g., sodium hydroxide (NaOH).

Figure 21:
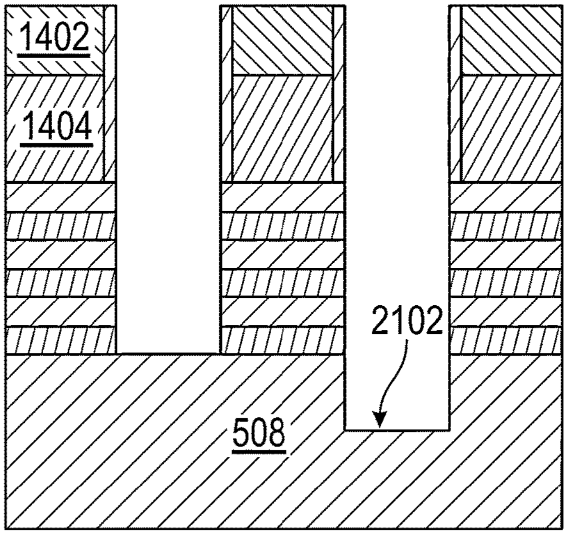
Figure 22:
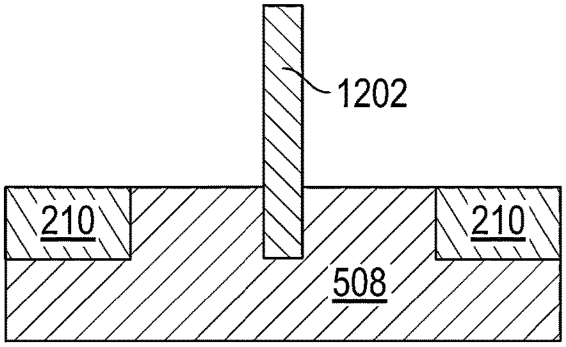
Figure 23:
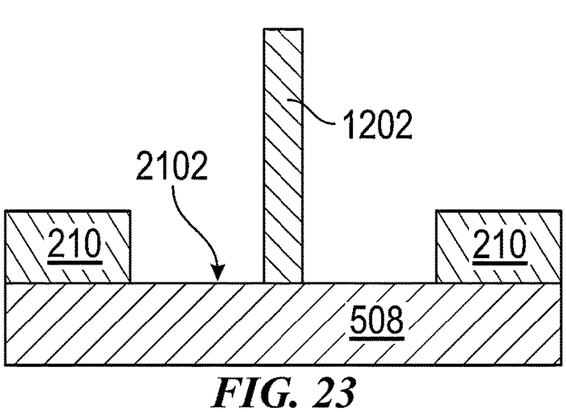
Figure 24:
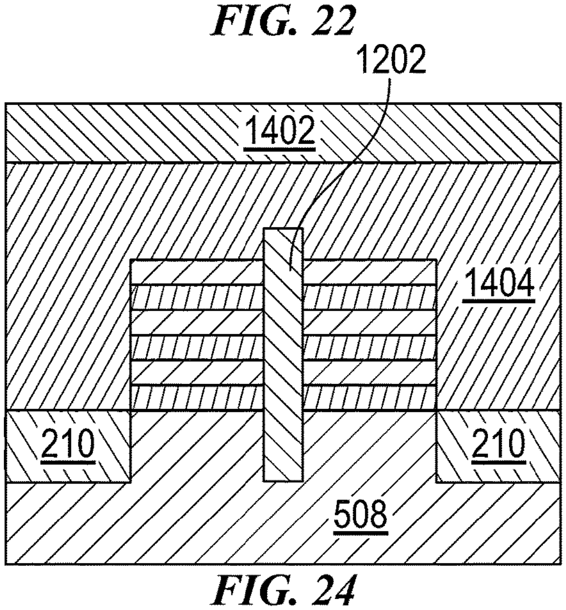
Figure 25:
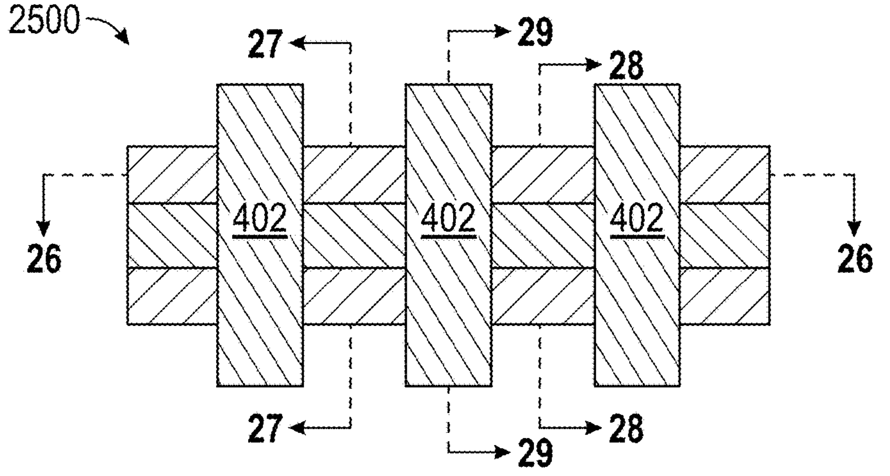
FIG. 25 through FIG. 29 depict sectioned views of an intermediate structure after partly filling the drain trench with sacrificial material, epitaxially growing source and drain structures, replacing the dummy gate with high-k metal gate material, and depositing interlayer dielectric.
Figure 26:
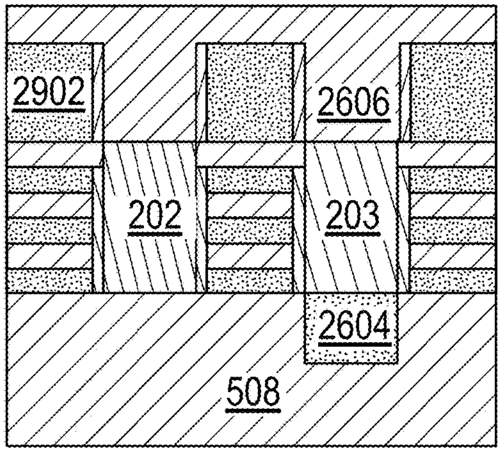
Figure 27:
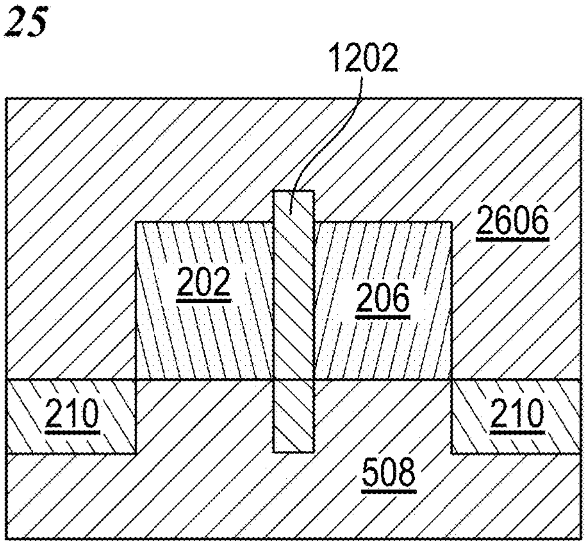
Figure 28:
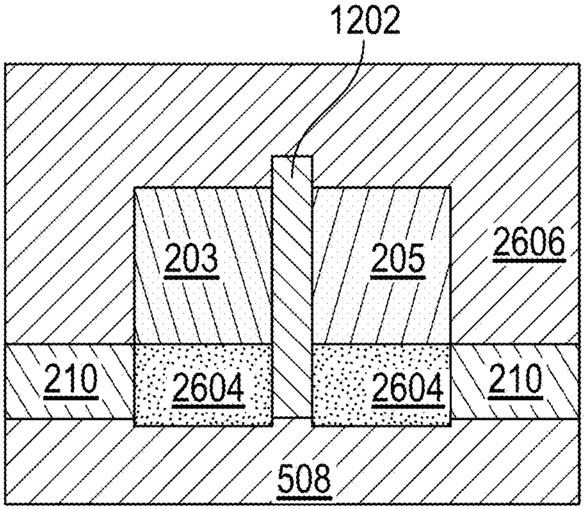
Figure 29:
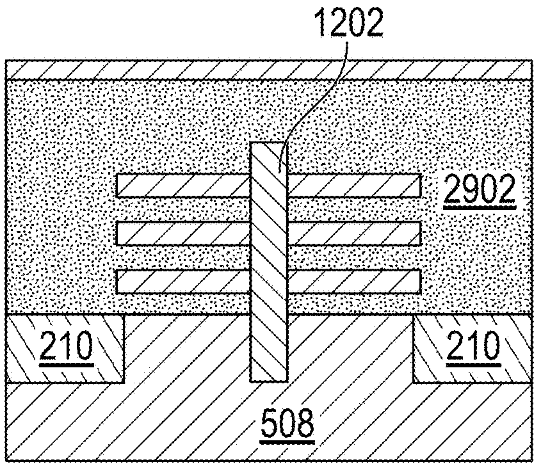
Figure 30:
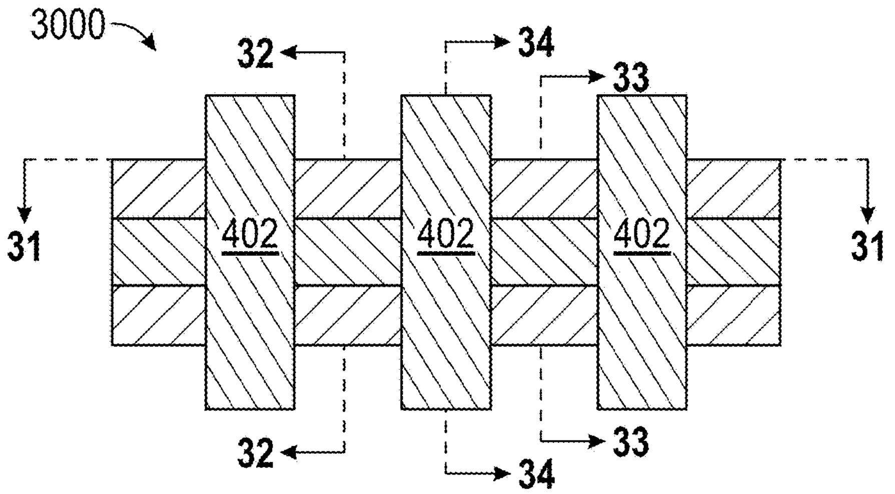
FIG. 30 through FIG. 34 depict sectioned views of an intermediate structure after forming source contacts, a gate contact, and interconnect layers and then inverting the structure onto a carrier wafer.
Figure 31:
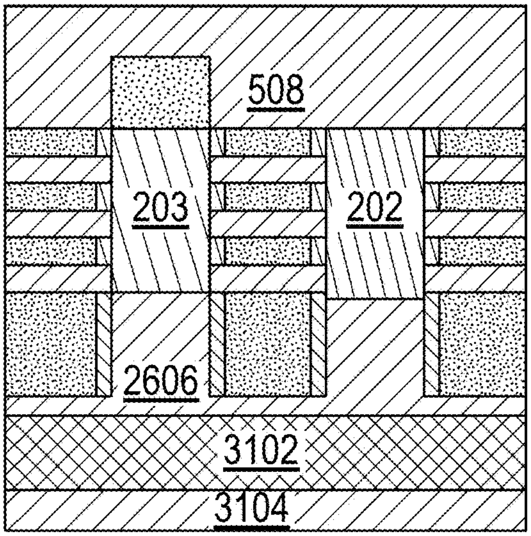
Figure 32:
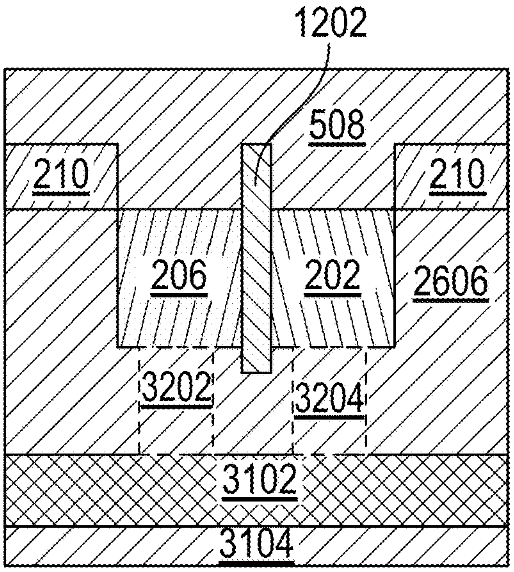
Figure 33:
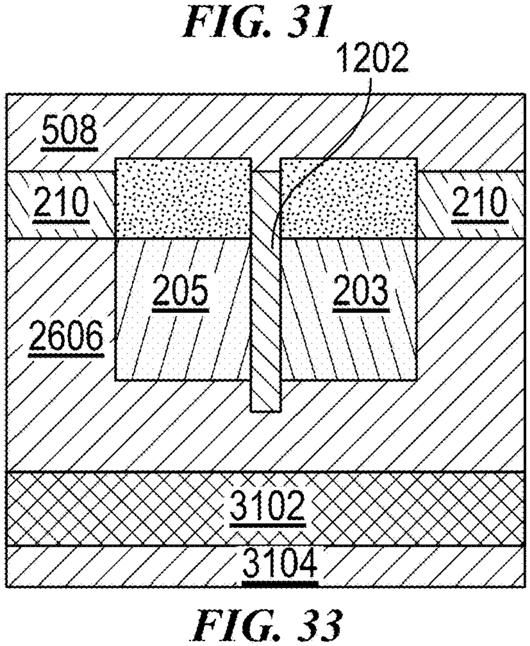
Figure 34:
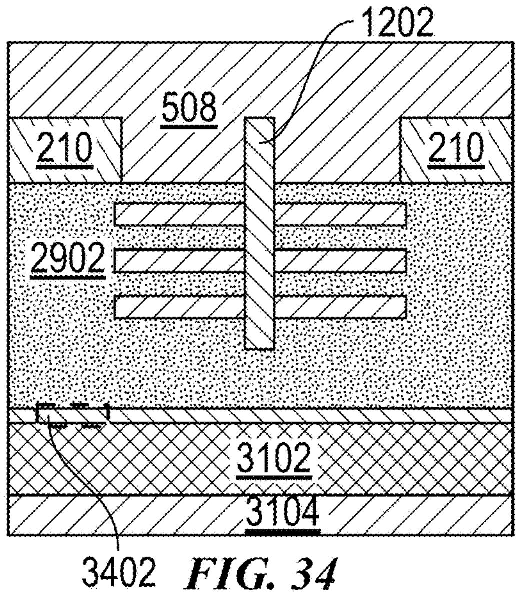
Figure 35:
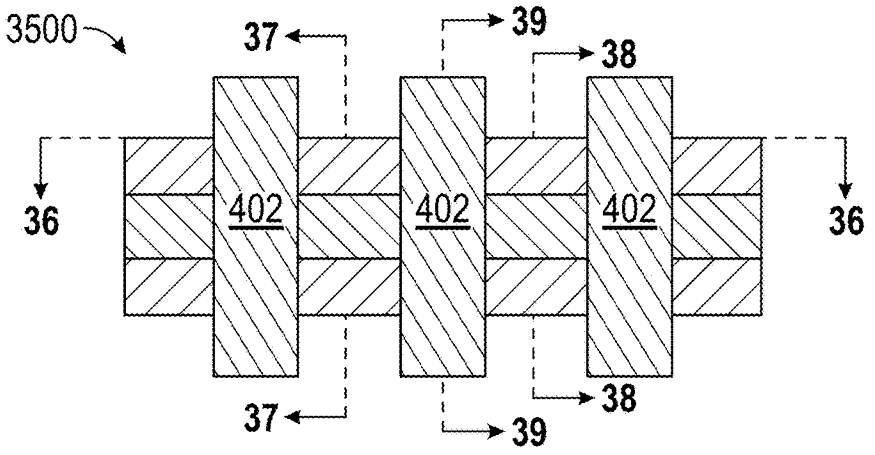
FIG. 35 through FIG. 39 depict sectioned views of an intermediate structure after removing the original substrate.
Figure 36:
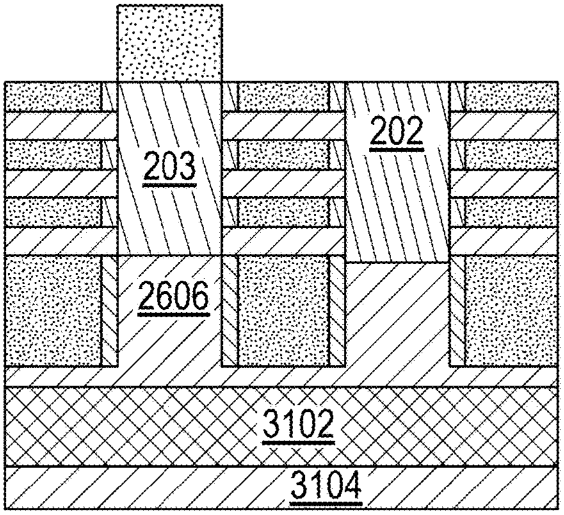
Figure 37:
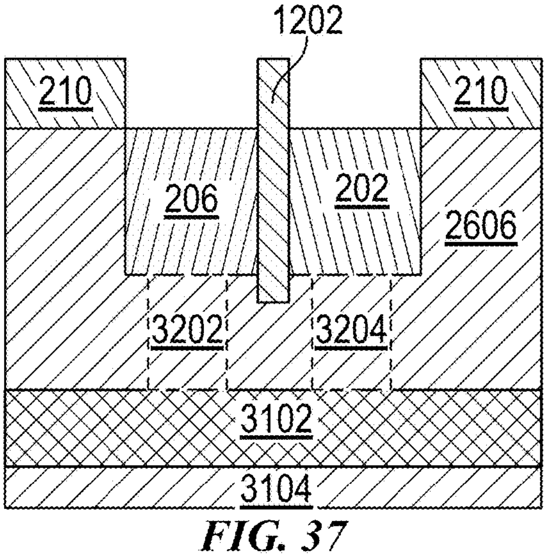
Figure 38:
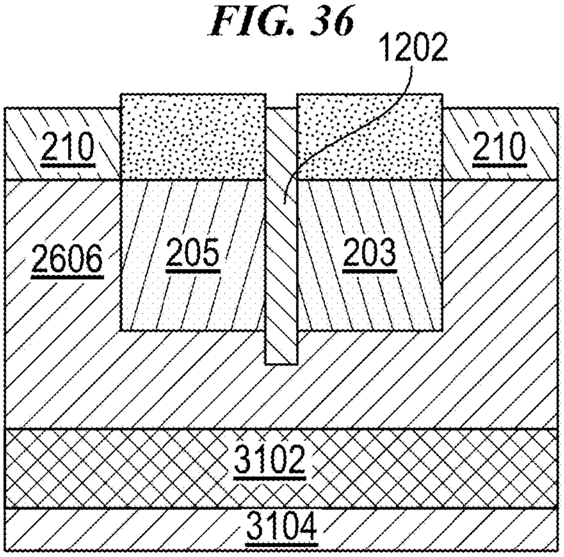
Figure 39:
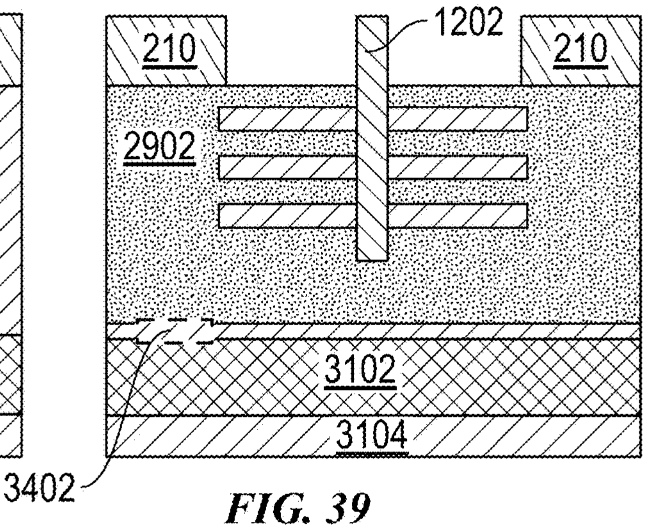
Figure 40:
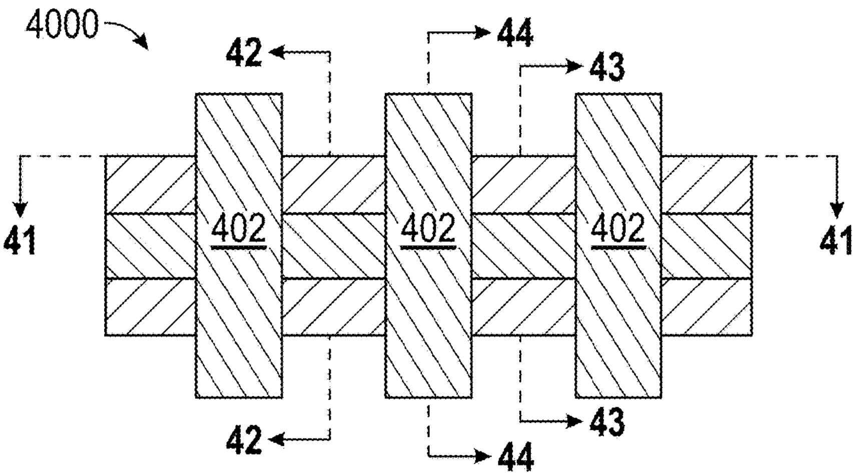
FIG. 40 through FIG. 44 depict sectioned views of an intermediate structure after depositing interlayer dielectric.
Figure 41:
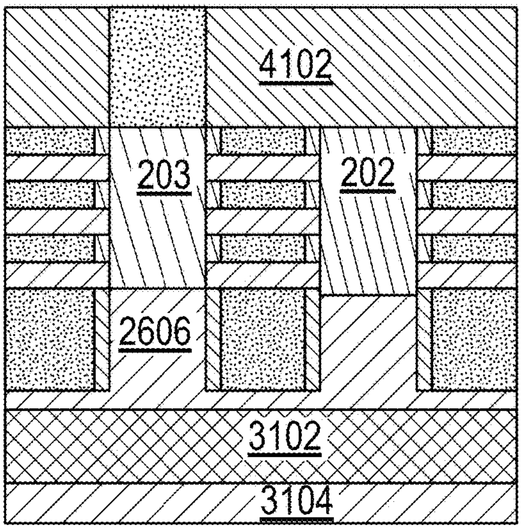
Figure 42:
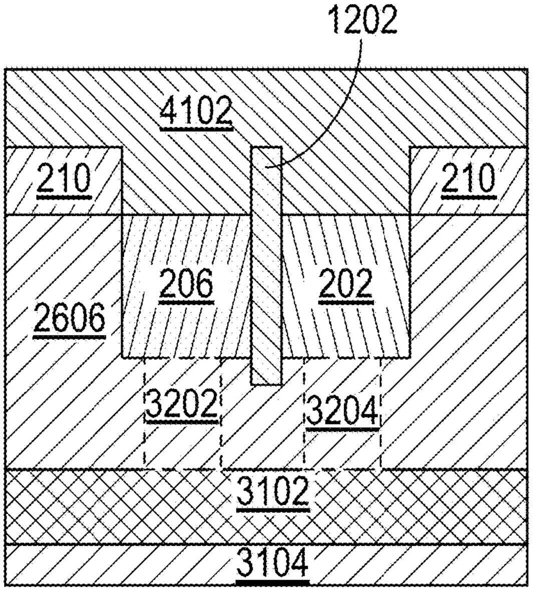
Figure 43:
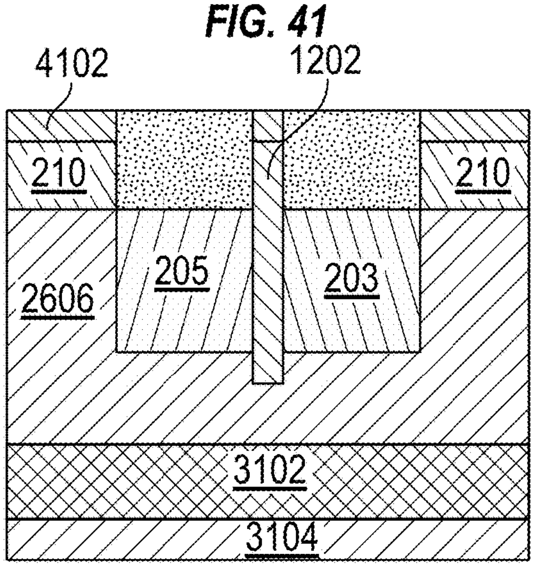
Figure 44:
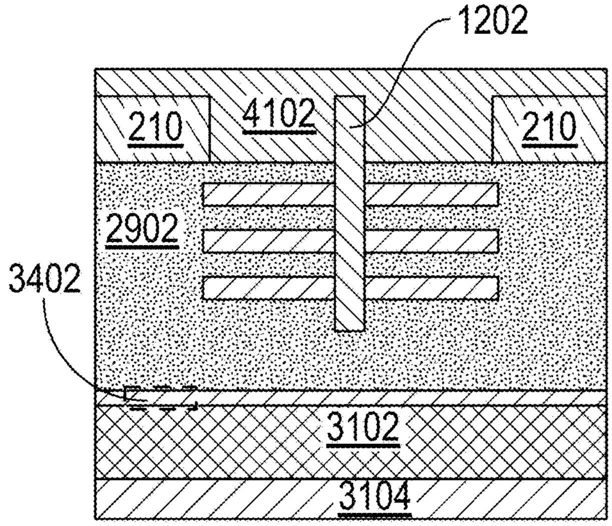
Figure 45:
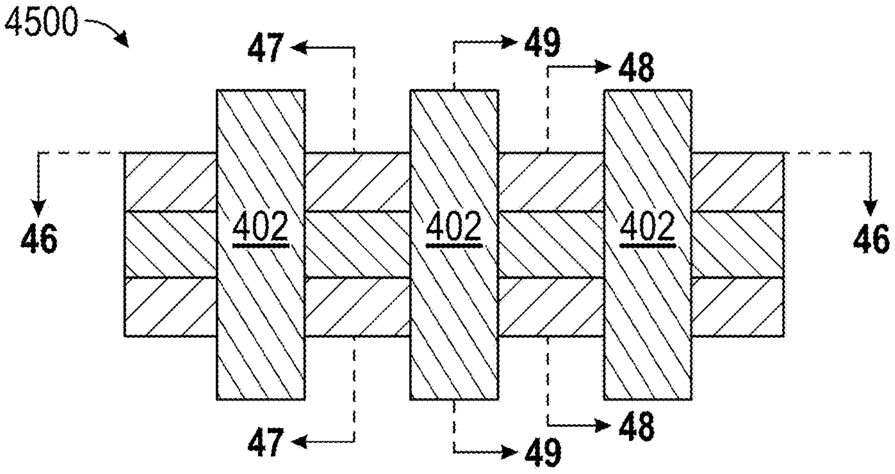
FIG. 45 through FIG. 49 depict sectioned views of an intermediate structure after indenting a backside contact trench by removing sacrificial material and the dielectric isolator between the nFET and pFET drains.
Figure 46:
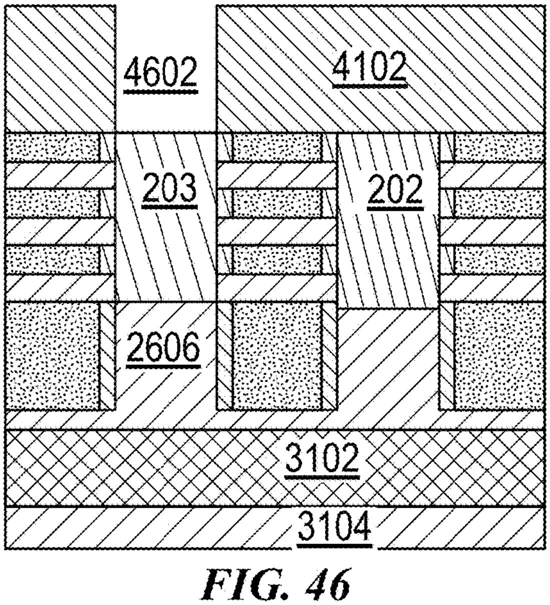
Figure 47:
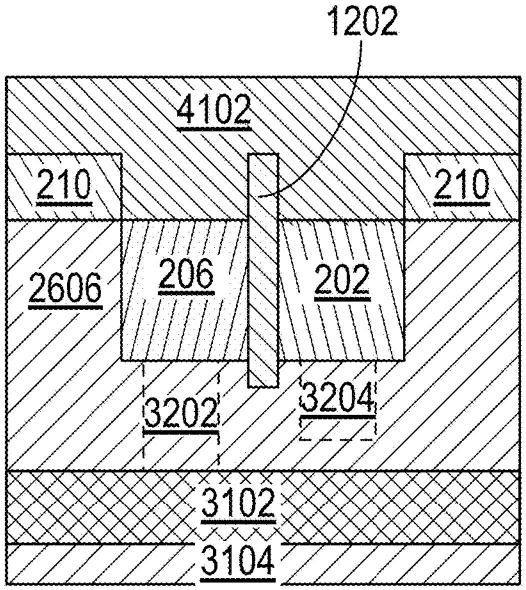
Figure 48:
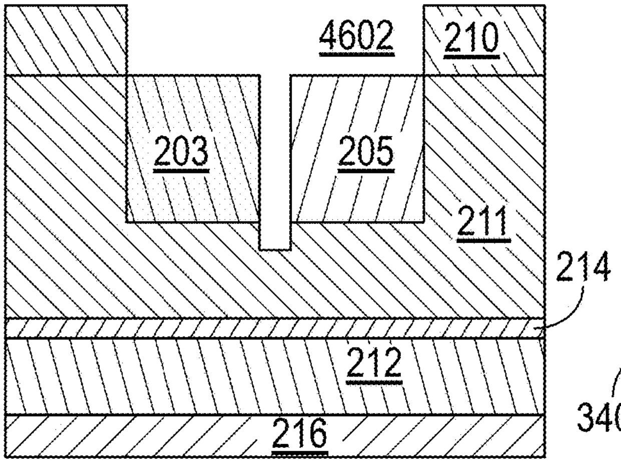
Figure 49:
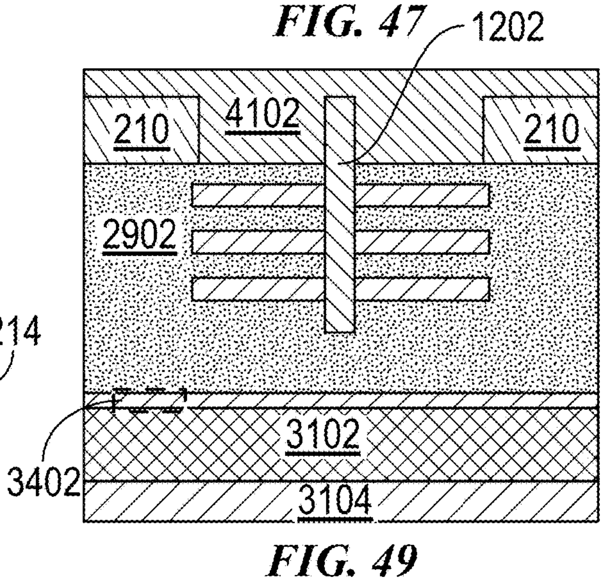

FIG. 25 through FIG. 29 depict sectioned views of an intermediate structure 2500 after removing the hard mask 1402 (e.g., by chemical mechanical planarization), partly filling the drain trench 2102 (as seen in FIG. 21) with sacrificial material 2604, epitaxially growing source and drain structures 203, 205, 202, 206, replacing the dummy gate 1404 and sacrificial layers 504 with high-k metal gate stacks 2902, and depositing interlayer dielectric 2606. FIG. 26, FIG. 27, FIG. 28, and FIG. 29, respectively, are taken along view lines 26, 27, 28, and 29 in FIG. 25. Suitable sacrificial materials can include, e.g., silicon germanium, silicon dioxide, silicon nitride, silicon carbide, or amorphous silicon. The source structures 202, 206 are epitaxially grown from the substrate 508 and from the nanosheet stack 503; the drains 203, 205 are epitaxially grown from the nanosheet stack 503. The dummy gate 1404 and sacrificial layers 504 are removed by wet etch, which leaves the layers 506 as channel structures. In one or more embodiments, the wet etch uses chemistry such as a bath of acetic acid ($CH_3COOH$), hydrogen peroxide ($H_2O_2$), and hydrofluoric acid (HF). Other options for the wet etch will be apparent to the skilled worker. The layers of high-k metal gate material (i.e., high-k dielectric(s) and gate metal(s)) are deposited by atomic layer deposition (ALD), and/or physical vapor deposition (PVD). Thus, the high-k metal gate stacks 2902 surround the silicon layers 506 on at least three sides.

Gate stacks in both nFET and pFET structures (in embodiments having both types of regions) include work function material (WFM) layers. Non-limiting examples of suitable work function (gate) metals include p-doped work function materials and n-doped work function materials. P-doped work function materials include compositions such as ruthenium, palladium, platinum, cobalt, nickel, and conductive metal nitride like TiN, WN, or any combination thereof. N-doped work function materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function material(s) may be deposited by a suitable deposition process, for example, ALD, CVD, PECVD, PVD, plating, and thermal or e-beam evaporation. Pinch-off of work function material between semiconductor fins is essentially avoided during deposition. The WFM layer is removed from one of the nFET and pFET regions in structures including both types of regions while the other region is protected. An SC1 etch, an SC2 etch or other suitable etch processes can be employed to remove the selected portion of the originally deposited WFM layer. A new WFM layer suitable for the region is then deposited. A device formed in the nFET region will accordingly include a WFM layer (gate electrode) having a first composition while a device in the pFET region will have a WFM layer having a second composition. For example, the WFM employed in an nFET region may be a Ti, Al, TiAl, TiAlC or TiAlC layer or a metal stack such as TiN/TiAl/TiN, TiN/TiAlC/TiN, TiN/TaAlC/TiN, or any combination of an aluminum alloy and TiN layers. The WFM layer employed in the pFET region may, for example, be a TiN, TiC, TaN or a tungsten (W) layer. The threshold voltage (Vt) of nFET devices is sensitive to the thickness of work function materials such as titanium nitride (TiN).

FIG. 30 through FIG. 34 depict sectioned views of an intermediate structure 3000 after forming source contacts 3202, 3204, a gate contact 3402, and interconnect layers 3102, and then inverting the structure onto a carrier wafer 3104. FIG. 31, FIG. 32, FIG. 33, and FIG. 34, respectively, are taken along view lines 31, 32, 33, and 34 in FIG. 30. In FIG. 30 through FIG. 34, the substrate 508 is at the "top" of the structure 3000, ready for further processing, which will be described with reference to FIG. 35 through FIG. 49. Suitable materials for the source contacts 3202, 3204 and for the gate contact 3402 include, e.g., tantalum (Ta), aluminum (Al), platinum (Pt), gold (Au), titanium (Ti), palladium (Pd) or any combination thereof. The contact material may be deposited by, for example, chemical vapor deposition (CVD), plasma-enhanced CVD (PECVD), physical vapor deposition (PVD), plating, thermal or e-beam evaporation, or sputtering. A planarization process such as CMP is performed to remove any electrically conductive material (overburden) from the top surface of the structure. The skilled worker will appreciate that, in one or more embodiments, the interconnect layers 3102 include dielectrics and metals configured to connect adjacent transistors (not shown).

FIG. 35 through FIG. 39 depict sectioned views of an intermediate structure 3500 after removing the original substrate 508. FIG. 36, FIG. 37, FIG. 38, and FIG. 39, respectively, are taken along view lines 36, 37, 38, and 39 in FIG. 35. Note that chemical mechanical planarization is not suitable for removing the substrate 508, because the protruding sacrificial material 2604 should remain for subsequent steps. In one or more embodiments, a wet etch chemistry may be suitable for removing the substrate 508, selective to the sacrificial material 2604. Accordingly, it is advantageous to have the sacrificial material 2604 of different composition than the substrate 508. Additionally, a wet etch process for removing the substrate 508 allows the protruding shallow trench isolation 210 and the protruding dielectric isolator pillar 1202 to remain in place. Thus, it may be advantageous to have the sacrificial material 2604 be of similar composition as the dielectric isolator pillar 1202 and the shallow trench isolation 210. For example, if the substrate 508 is silicon, the sacrificial material 2604, the dielectric isolator pillar 1202, and the shallow trench isolation 210 may be silicon nitride, silicon carbide, or silicon oxide. In one or more embodiments, the sacrificial material 2604 may be flowable silicon carbide.

FIG. 40 through FIG. 44 depict sectioned views of a precursor 4000 after depositing interlayer dielectric (ILD) 4102. FIG. 41, FIG. 42, FIG. 43, and FIG. 44, respectively, are taken along view lines 41, 42, 43, and 44 in FIG. 40. Because in a subsequent step the sacrificial material 2604 and the dielectric isolator pillar 1202 will be removed to form a backside contact trench 4602 (shown in FIG. 46 and FIG. 48), in one or more embodiments it is advantageous to have the interlayer dielectric 4102 be of a different composition than the sacrificial material 2604 and the dielectric isolator pillar 1202. On the other hand, if an anisotropic process (e.g., RIE) is used for removing the sacrificial material 2604 and 1202, or if lithography is used to mask off portions of the interlayer dielectric 4102 that should be retained, then the ILD 4102 could be of the same composition as the sacrificial material 2604 and the dielectric isolator pillar 1202.

FIG. 45 through FIG. 49 depict sectioned views of an intermediate structure 4500 after indenting the backside contact trench 4602 by removing the sacrificial material 2604 and the dielectric isolator pillar 1202 between the nFET drain structure 203 and the pFET drain structure 205. FIG. 46, FIG. 47, FIG. 48, and FIG. 49, respectively, are taken along view lines 46, 47, 48, and 49 in FIG. 45. As mentioned, various processes (e.g., RIE, lithography) can be used in producing the structure 4500 with the trench 4602. Preferably, the trench 4602 extends across the entire upper surfaces of the two drains 203, 205 and down the entire inward vertical surfaces of the two drains.

Figure 50:
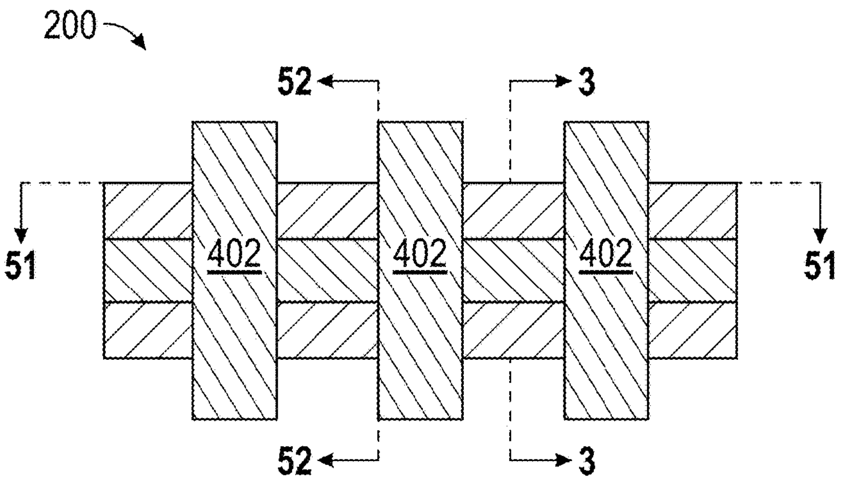
FIG. 50 through 52 depict additional sectioned views of the CMOS apparatus that is shown in FIG. 3, after forming the backside contact in its trench.
Figure 51:
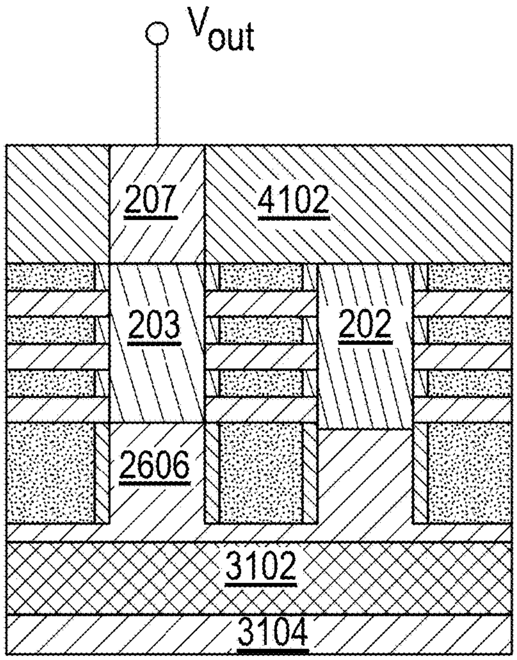
Figure 52:
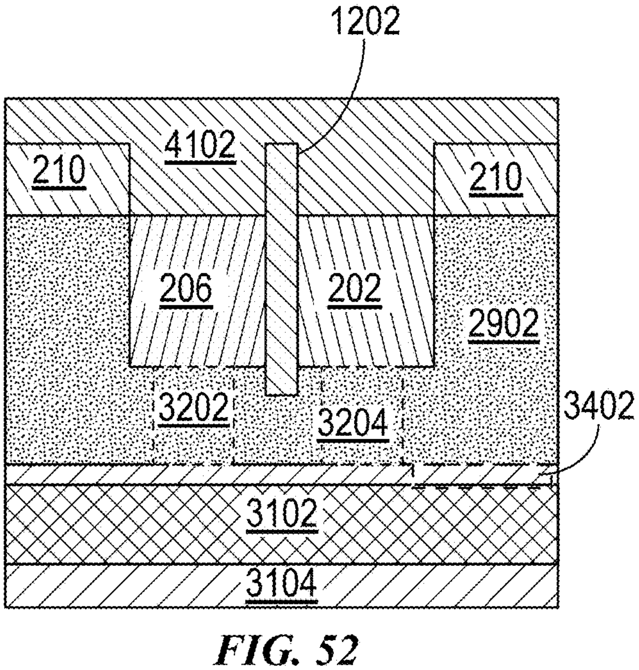

FIG. 50 through 52 depict additional sectioned views of the CMOS apparatus 200 that is shown in FIG. 3, after forming the backside contact 207 in its trench. FIG. 3, FIG. 51, and FIG. 52, respectively, are taken along view lines 3, 51, and 52 in FIG. 50. Preferably, the backside contact 207 has a pronounced T shape (as best seen in FIG. 3) that comprises a metal pillar 301 between the drains 203, 205 and a metal bar 302 covering upper surfaces of the drains 203, 205, so that electrical contact is formed not only with the entire upper surfaces of the drains 203, 205 but also with the inward vertical surfaces of the drains 203, 205. Advantageously, this enhanced electrical contact (relative to conventional contact arrangements) improves conductivity and switching time for the CMOS apparatus 200 (compared to a conventional CMOS apparatus 100, as shown in FIG. 2).

Given the discussion thus far, and with reference to the accompanying drawings, it will be appreciated that, in general terms, an exemplary CMOS apparatus 200 (as shown in FIG. 2 and FIG. 3)(for example, an inverter or other logic gate/element), according to embodiments of the invention, includes an interconnect layer $V_{in}$; an n-doped field effect transistor (nFET) 204; and a p-doped field effect transistor (pFET) 201. A direction from the front side toward the backside is a backside direction of the device. The nFET is disposed at the backside of the interconnect layer and includes an nFET drain structure 205, an nFET source structure 206, and an nFET channel structure 222 that is connected between the nFET drain structure and the nFET source structure. The nFET has a front side surface adjacent the interconnect layer and a backside surface opposite the interconnect layer. The pFET 201 also is disposed at the backside of the interconnect layer adjacent to the nFET and includes a pFET drain structure 203, a pFET source structure 202, and a pFET channel structure 220 that is connected between the pFET drain structure and the pFET source structure. The pFET has a front side surface adjacent the interconnect layer and a backside surface opposite the interconnect layer. The CMOS apparatus includes a backside drain contact 207, which is disposed at the backside surface of the nFET and the pFET, electrically connects the nFET drain structure and the pFET drain structure to a backside interconnect layer $V_{out}$. In some instances, the CMOS apparatus also includes a gate stack 2902 (first shown in FIG. 29), which is disposed at the front side of the source and drain structures; the gate stack is shared by the nFET and the pFET; a gate contact, which electrically connects the gate stack to the interconnect layer; source contacts, which electrically connect the nFET source structure and the pFET source structure to the interconnect layer. The interconnect layer includes metal gate traces, source traces, and interconnect traces and has a front side and a backside opposite the front side.

In one or more embodiments, the backside drain contact 207 includes a metal pillar 301, which is disposed between, and directly electrically contacts, adjacent facing surfaces of the nFET and pFET drain structures. In one or more embodiments, the backside drain contact also includes a metal bar 302, which is connected crosswise and contiguous to the metal pillar and directly electrically contacts the backside surfaces of the nFET and pFET drain structures. In some embodiments, the metal bar electrically contacts an entirety of the backside surfaces of the nFET and pFET drain structures. In certain embodiments, the CMOS apparatus also includes shallow trench isolation at either side of the metal bar.

In one or more embodiments the CMOS apparatus also includes an interlayer dielectric, which is disposed between the nFET and pFET drain structures and the interconnect layer. In some such embodiments, the metal pillar extends beyond the nFET and pFET drain structures into the interlayer dielectric.

In one or more embodiments the CMOS apparatus also includes shallow trench isolation material at either side of the backside drain contact.

In one or more embodiments the gate stack of the CMOS apparatus is a gate-all-around gate structure between the sources and the drains. In one or more embodiments the gate stack of the CMOS apparatus is a forksheet gate structure between the sources and the drains.

Another aspect provides a method for making a CMOS apparatus. The method includes obtaining a precursor 4000 to the CMOS apparatus; forming, in a backside dielectric of the precursor, a trench 4602 that contacts backside surfaces of adjacent drain structures; and filling the trench, from the backside of the device, with a conductive material 207 such that the conductive material contacts the backside surfaces of the adjacent drain structures and also contacts the adjacent facing surfaces of the adjacent drain structures. The precursor includes an nFET drain structure 205; a pFET drain structure 203 that is adjacent to the nFET drain structure; and a dielectric pillar 1202 that extends from the backside dielectric between and contacting adjacent facing surfaces of the adjacent drain structures. Forming the trench includes removing the dielectric pillar.

In one or more embodiments, obtaining the precursor includes forming a blank 400 that has a substrate 508, a source portion of the substrate, a drain portion of the substrate, and a gate portion between the source portion and the drain portion. Each of the source portion, the drain portion, and the gate portion includes a continuous stack of nanosheets 504, 506 that are stacked on the substrate, and each of the source portion, the drain portion, and the gate portion is split in half by a continuous dielectric pillar 1202 that extends through the source portion, the drain portion, and the gate portion. Obtaining the precursor also includes forming a dummy gate 1404 and a hard mask 1402 over the source, drain, and gate portions of the blank; removing the hard mask, the dummy gate, and the stack of nanosheets from the source portion and from the drain portion of the blank; indenting the source portion at each side of the dielectric pillar to a first depth 1702 below a top surface of the substrate; and indenting the drain portion at each side of the dielectric pillar to a second depth 2102, deeper than the first depth, below the top surface of the substrate.

In one or more embodiments, the second depth is deeper than a bottom of the dielectric pillar.

In one or more embodiments, the method also includes filling a sacrificial material 2604 into the indentations of the drain portion to a level that is flush with the top surface of the substrate 508. In one or more embodiments, the method also includes, after filling the sacrificial material, epitaxially growing drain structures 203, 205, from the nanosheets in the gate portion, at either surface of the dielectric pillar on the drain portion of the blank. In one or more embodiments, the method also includes, before forming the trench in the backside surface of the precursor, inverting the precursor. In one or more embodiments, the method also includes, before inverting the precursor, bonding a carrier wafer 3104 to the blank. In one or more embodiments, the method also includes, after inverting the precursor and before forming the trench, recessing the substrate of the precursor. In one or more embodiments, the method also includes, after recessing the substrate, depositing a backside dielectric 4102. In one or more embodiments, the method also includes, before forming the trench, planarizing the backside dielectric flush with backside surfaces of the sacrificial material. In one or more embodiments, the method also includes, before inverting the precursor: epitaxially growing source structures 202, 206, from the nanosheets of the gate portion, on the source portion of the blank; and forming frontside contacts 3202, 3204 to the source structures.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A complementary metal-oxide-semiconductor (CMOS) apparatus comprising:

an interconnect layer, which has a front side and a backside opposite the front side;

an n-doped field effect transistor (nFET) disposed at the backside of the interconnect layer, wherein the nFET comprises an nFET drain structure, an nFET source structure, and an nFET channel structure that is connected between the nFET drain structure and the nFET source structure, wherein the nFET has a front side surface adjacent to the interconnect layer and a backside surface opposite to the interconnect layer;

a p-doped field effect transistor (pFET) disposed at the backside of the interconnect layer adjacent to the nFET, wherein the pFET comprises a pFET drain structure, a pFET source structure, and a pFET channel structure that is connected between the pFET drain structure and the pFET source structure, wherein the pFET has a front side surface adjacent to the interconnect layer and a backside surface opposite to the interconnect layer;

a backside drain contact disposed at the backside surface of the nFET and the pFET and electrically connected to the nFET drain structure and to the pFET drain structure; and a gate stack including a forksheet gate structure between source structures and drain structures.

2. The CMOS apparatus of claim 1, wherein the backside drain contact comprises:

a metal pillar disposed between, and directly contacting, adjacent facing surfaces of the nFET and pFET drain structures.

3. The CMOS apparatus of claim 2, wherein the backside drain contact further comprises:

a metal bar connected crosswise and contiguous to the metal pillar and directly contacting the backside surfaces of the nFET and pFET drain structures.

4. The CMOS apparatus of claim 2, wherein the backside drain contact further comprises:

a metal bar connected crosswise and contiguous to the metal pillar and directly contacting an entirety of the backside surfaces of the nFET and pFET drain structures.

5. The CMOS apparatus of claim 4, further comprising: shallow trench isolation at either side of the metal bar.

6. The CMOS apparatus of claim 2, further comprising an interlayer dielectric disposed between the nFET and pFET drain structures and the interconnect layer, wherein the metal pillar extends beyond the nFET and pFET drain structures into the interlayer dielectric.

7. The CMOS apparatus of claim 1, further comprising: shallow trench isolation material at either side of the backside drain contact.

8. The CMOS apparatus of claim 1, wherein the backside drain contact is T-shaped to cover upper surfaces of the nFET drain structure and the pFET drain structure and inward vertical surfaces of the nFET drain structure and the pFET drain structure.

* * * * *